US 8,304,855 B2

Nov. 6, 2012

(12) United States Patent
Smith (54) VERTICAL CAPACITORS FORMED ON SEMICONDUCTING SUBSTRATES

(75) Inventor: David M. Smith, Sebastian, FL (US)

(73) Assignee: Harris Corporation, Melbourne, FL (US)

( * ) Notice: Subject to any disclaimer, the term of this patent is extended or adjusted under 35 U.S.C. 154(b) by 185 days.

(21) Appl. No.: 12/850,400

(22) Filed: Aug. 4, 2010

(65) Prior Publication Data

US 2012/0032302 A1 Feb. 9, 2012

(51) Int. Cl.
 *H01L 21/02* (2006.01)
 *H01L 21/20* (2006.01)

(52) U.S. Cl. ......... 257/534; 257/E21.012; 257/E29.342; 438/396

(58) Field of Classification Search .................. 257/534, 257/532, E21.012, E29.342; 438/396, 381, 438/387
See application file for complete search history.

(56) References Cited

U.S. PATENT DOCUMENTS

| | | | |
|---|---|---|---|
| 4,833,437 A | 5/1989 | Williamson | |
| 5,206,621 A | 4/1993 | Yerman | |
| 5,410,289 A | 4/1995 | Futa | |
| 5,949,383 A | 9/1999 | Hayes et al. | |
| 6,064,108 A | 5/2000 | Martinez | |
| 6,094,335 A * | 7/2000 | Early | 361/303 |
| 6,111,545 A | 8/2000 | Saari | |
| 6,163,300 A | 12/2000 | Ishikawa et al. | |
| 6,232,925 B1 | 5/2001 | Fujikawa | |
| 6,337,663 B1 | 1/2002 | Chi-Ming | |
| 6,356,244 B1 | 3/2002 | Mizuno et al. | |
| 6,664,026 B2 | 12/2003 | Nguyen et al. | |
| 6,714,113 B1 | 3/2004 | Abadeer et al. | |
| 6,756,708 B2 | 6/2004 | Koeneman | |
| 6,891,219 B2 * | 5/2005 | Allman et al. | 257/311 |
| 6,894,646 B2 | 5/2005 | Washiro et al. | |
| 6,972,635 B2 | 12/2005 | McCorquodale et al. | |
| 7,035,083 B2 | 4/2006 | Lin et al. | |
| 7,064,629 B2 | 6/2006 | Shoji | |
| 7,068,139 B2 | 6/2006 | Harris et al. | |
| 7,126,452 B2 | 10/2006 | Teshima et al. | |
| 7,202,821 B2 | 4/2007 | Fujikawa et al. | |
| 7,477,123 B2 | 1/2009 | Beerling | |
| 7,486,237 B2 | 2/2009 | Huang et al. | |
| 7,671,515 B2 | 3/2010 | Metz et al. | |
| 7,675,463 B2 | 3/2010 | Wallace et al. | |
| 2003/0122219 A1 | 7/2003 | Park | |
| 2004/0046232 A1 | 3/2004 | Lee et al. | |

(Continued)

OTHER PUBLICATIONS

Samavati, H., et al., "Fractal Capacitors", IEEE Journal of Solid-State Circuits, vol. 33, No. 12, Dec. 1998; pp. 2035-2041.

(Continued)

*Primary Examiner* — A. Sefer
*Assistant Examiner* — Nikolay Yushin
(74) *Attorney, Agent, or Firm* — Fox Rothschild, LLP; Robert J. Sacco (57) ABSTRACT

Semiconductor devices (100) and methods of making the same. Each of the semiconductor devices includes a substrate (102) having a first surface (118) and an opposing second surface. A vertical capacitive element (104) is disposed on the first surface of the substrate. The vertical capacitive element comprises a plurality of parallel conductive plates (120b, 120d, 120f, 120h, 120j, 120l, 120n) extending transverse to the first surface of the substrate. Adjacent conductive plates are spaced a distance D from each other. A dielectric material (104) can be disposed in a space separating the adjacent conductive plates. Each of the conductive plates has a height-to-width (h/w) ratio greater than or equal to one.

11 Claims, 4 Drawing Sheets

U.S. PATENT DOCUMENTS

| | | |
|---|---|---|
| 2006/0203421 A1 | 9/2006 | Morris, III et al. |
| 2007/0256502 A1 | 11/2007 | Aebersold et al. |
| 2008/0055815 A1 | 3/2008 | Rottenberg |
| 2008/0122020 A1 | 5/2008 | Metz et al. |
| 2009/0188325 A1* | 7/2009 | Aebersold et al. .............. 73/780 |

OTHER PUBLICATIONS

Kim, K., et al., "Circuit Modeling of Interdigitated Capacitors Fabricated by High-K LTCC Sheets", ETRI Journal, vol. 28, No. 2, Apr. 2006; pp. 182-190.

Smith, D., et al., U.S. Appl. No. 12/490,605, filed Jun. 24, 2009, entitled "Inductor Structures for Integrated Circuit Devices".

Smith, D., U.S. Appl. No. 12/783,880, filed May 20, 2010, entitled "High Q Vertical Ribbon Inductor on Semiconducting Substrate".

Information about Related Patents and Patent Applications, see section 6 of the accompanying Information Disclosure Statement Letter, which concerns Related Patents and Patent Applications, Aug. 4, 2010.

Harris Corporation, International Search Report mailed Jul. 22, 2011, U.S. Appl. No. PCT/US2011/037263.

* cited by examiner

VERTICAL CAPACITORS FORMED ON SEMICONDUCTING SUBSTRATES

FIELD OF THE INVENTION

The inventive arrangements relate to passive elements, and more specifically, to capacitors formed on semiconducting substrates.

BACKGROUND

There are various passive electronic components known in the art for use in electronic circuits. Such passive electronic components include, but are not limited to, resistors, inductors and capacitors. Capacitors generally consist of one or more pairs of thin conductor plates separated by a non-conducive layer. The conductive plates extend uniformly over an area, and are usually made of metal. The non-conductive layer is formed of a dielectric material with a permittivity $\in$. Such dielectric materials include, but are not limited to, ceramic materials, glass materials, paper materials, mica materials (e.g., silver mica) and plastic materials (e.g., polycarbonate, polyester, polystyrene and polypropylene).

The capacitor is characterized by a capacitance C defined by the following mathematical equations (1).

$$C=Q/V=Q/[Qd/\in A]=\in A/d \quad (1)$$

where C represents the capacitance of the capacitor. Q represents the ratio of charges on the facing surfaces of the conductive plates. V represents the voltages between the conductive plates. d is the distance between the conductive plates. A represents the "active area", i.e, the area described by the overlap of two (2) conductive plates. As evident from mathematical equation (1), the capacitance C increases with area A and decreases with separation d. As also evident from mathematical equation (1), the capacitance C is greatest in capacitors having a non-conductive region made from dielectric materials with a high permittivity $\in$.

Micro-Electro-Mechanical Systems (MEMS) technology is currently being used to form capacitors on semiconducting substrates. These capacitors are referred to herein as "MEMS capacitors". The MEMS capacitors typically have at least one dimension between 1 to 100 micrometers (i.e. 0.001 um to 0.1 um). The MEMS capacitors typically comprise a plurality of stacked conductive plates disposed on the semiconducting substrate so as to extend horizontal to a surface of the semiconducting substrate. Each of the conductive plates typically has a height-to-width (h/w) ratio substantially less than one (1). As noted above, the capacitance C of the capacitor increases with the area A of the conductive layers. Therefore, larger valued MEMS capacitors take up more space on the semiconducting substrate as compared to the die space taken-up by smaller valued MEMS capacitors.

Although there have been improvements in the development of MEMS capacitors, there is a continuing demand for the reduction in the size of MEMS capacitors. Therefore, it is desirable to provide an improved MEMS capacitor design which requires less real estate on the die as compared to conventional MEMS capacitor designs.

SUMMARY OF THE INVENTION

Embodiments of the present invention generally concern semiconductor devices. Each of the semiconductor devices comprises a substrate (e.g., a semiconducting substrate) having a first surface and an opposing second surface. A vertical capacitive element is disposed on the first surface of the substrate. A ground plane can be disposed on the second surface of the substrate.

Figure 1:
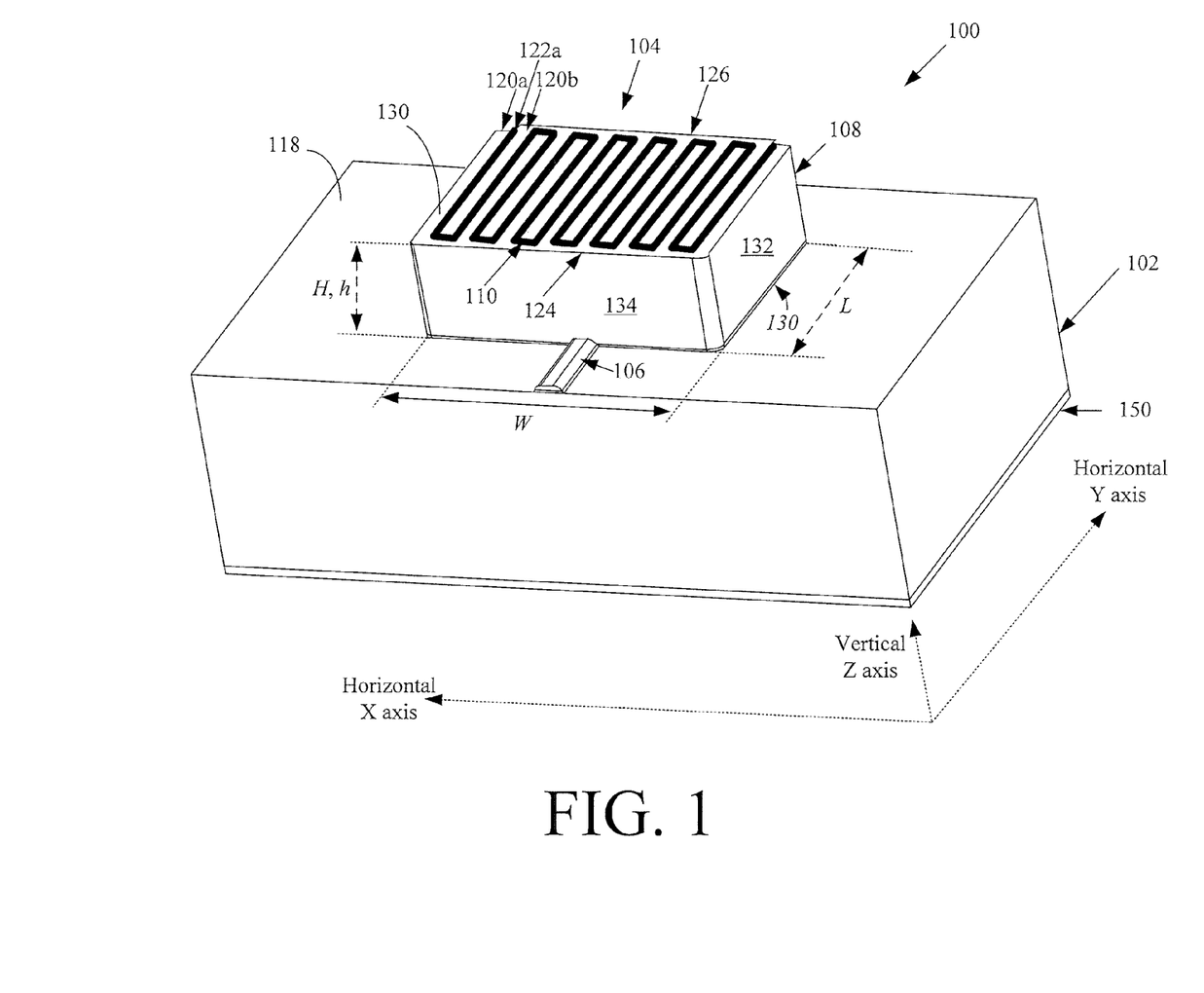
FIG. 1 is a perspective view of an exemplary semiconductor device that is useful for understanding the present invention.
Figure 2:
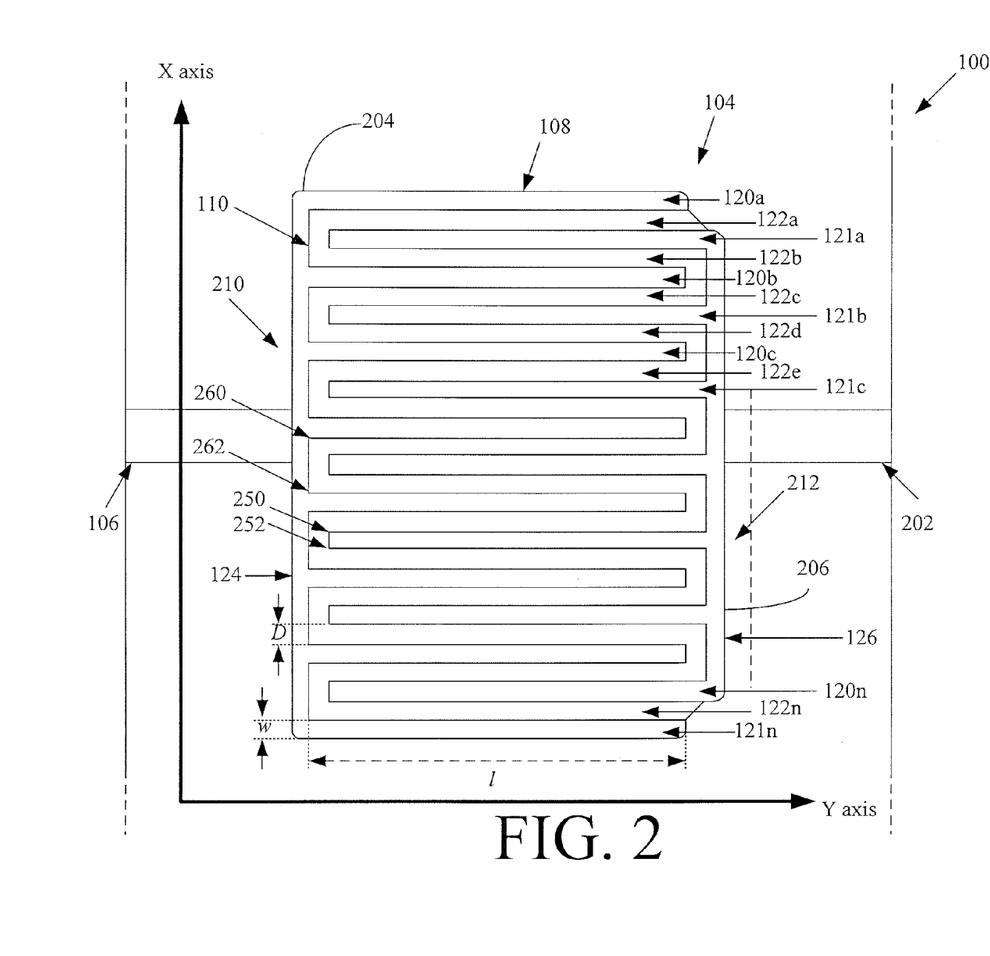
FIG. 2 is a top view of the semiconductor device shown in FIG. 1 that is useful for understanding the present invention.

The vertical capacitive element comprises a plurality of parallel conductive plates which are fixed with respect to each other. Each conductive plate extends transverse to the first surface of the substrate. Each conductive plate has a height-to-width (h/w) ratio greater than or equal to one. (note: the height h of the conductive plates is shown in FIG. 1 and the width w of the conductive plates is shown in FIG. 2). Adjacent conductive plates are spaced a distance D (shown in FIG. 2) from each other. A non-conductive material can be disposed in the space separating the adjacent conductive plates.

According to aspects of the present invention, the conductive plates form interdigitated fingers of first and second comb structures. In this scenario, an interconnection element can be provided to interconnect at least two interdigitated fingers. Also, a non-conductive material can be provided which extends along a meandering or serpentine path defined by interdigital spaces separating the interdigitated fingers. The interdigitated fingers form a series of parallel conductive plates, with each adjacent pair of conductive plates acting as a capacitor.

Embodiments of the present invention also concern methods for fabricating a semiconductor device. The methods comprise providing a semiconducting substrate having opposing first and second surfaces. The methods also comprise forming a vertical capacitive element on the substrate. The vertical capacitive element comprises a plurality of parallel conductive plates. Each conductive plate extends transverse to the first surface of the substrate. Each conductive plate has a height-to-width (h/w) ratio greater than or equal to one. Adjacent conductive plates are spaced a distance D from each other. The method further comprises: interconnecting two or more of the parallel conductive plates; and/or disposing a non-conductive material in a space separating the adjacent conductive plates.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

The present invention generally concerns passive elements, and more specifically, capacitors. The capacitors can include, but are not limited to, fixed capacitors, i.e., capacitors with stationary conductive plates that are fixed relative to each other. The capacitors of the present invention can be used in a variety of electronic applications. Such electronic applications include, but are not limited to, decoupling applications, filtering applications, tuning applications, and general charge storage applications.

The capacitors can include, but are not limited to, vertical capacitors formed on a semiconducting substrate. The vertical capacitors generally comprise two or more parallel conductive plates that extend transverse to a first surface of a semiconducting substrate. Such vertical capacitors overcome various drawbacks of conventional horizontal capacitors.

For example, a vertical capacitor as described herein requires less real estate on the die as compared to a conventional horizontal capacitor having the same capacitance. Stated differently, the vertical capacitor of the present invention provides a higher capacitance per unit area as compared to conventional horizontal capacitors. The reduced real estate requirement of the present invention is at least partially due to the fact that the vertical conductive plates thereof have a height-to-width (h/w) ratio that is greater than or equal to one (1), i.e., the height h is greater than or equal to the width w of the plate. As will become evident from the discussion relating to FIGS. 1-2, the height h of the conductive plates is measured along a horizontal X axis, and the width w of the conductive plates is measured along a vertical Z axis. In contrast, the horizontal conductive plates of conventional horizontal capacitors typically have a height-to-width (h/w) ratio that is substantially less than one (1), i.e., the height h is substantially less than the width w of the plate.

Furthermore, the vertical capacitor as described herein is not limited with regard to the number of conductive plates that can be used to form the multi-plate capacitor. In contrast, conventional horizontal capacitors are limited to the number of metallic layers that can be stacked on a semiconducting substrate to form the multi-layer capacitor. The metallic layer limitation of the conventional horizontal capacitors is at least partially a result of an annealing requirement of metal layers. For example, a first or base metal layer is disposed on a substrate. Thereafter, the first or base metal layer is annealed (i.e., subjected to heat). Upon completing the annealing process, a layer of a dielectric material is disposed over the annealed first or base metal layer. Subsequently, a second metal layer is applied over the dielectric material. In order to add another metal layer(s) to the stack, the second metal layer would have to be annealed. The second annealing process involves applying heat to the entire substrate. The second annealing process (or heat cycle) would dissipate the dielectric material, thereby leaving no dielectric between the metal layers. As such, conventional horizontal capacitors are limited to the number of metal layers that can be stacked. In contrast, the vertical capacitors of the present invention are not limited to the number of metal layers that can used to form the passive component. Consequently, the vertical capacitors of the present invention have a larger range of capacitances than that of the conventional horizontal capacitors.

The present invention will now be described in detail in relation to FIGS. 1-4. Notably, the present invention is described below in relation to interdigital (or interdigitated) MEMS capacitors. The present invention is not limited in this regard. For example, the present invention can be used with other types of capacitor structures. Such other types of capacitors structures include, but are not limited to, capacitor structures that only include two opposing plates.

Referring now to FIG. 1, there is provided a perspective view of a semiconductor device 100 that is useful for understanding the present invention. A top view of the semiconductor device 100 is provided in FIG. 2. According to embodiments of the present invention, the semiconductor device 100 is an Integrated Circuit (IC) semiconductor device. In this scenario, the semiconductor device 100 is connected to at least one other semiconductor device (not shown in FIGS. 1-2). Still, the present invention is not limited in this regard.

As shown in FIGS. 1-2, the semiconductor device 100 comprises an interdigital (or interdigitated) capacitor 104 that is disposed or formed on a first surface 118 of a semiconducting substrate 102. The semiconductor device 100 can also include a ground plane 150 disposed on or formed on a second surface (not shown in FIGS. 1-2) that is opposed from the first surface 118 of the semiconducting substrate 102. The semiconducting substrate 102 is generally provided to support the capacitor 104 and/or other semiconductor devices of an IC. The semiconducting substrate 102 can comprise any substrate material that is suitable for a particular application. For example, the semiconducting substrate 102 can include a silicon substrate.

The semiconductor device 100 can be produced using deposition techniques, photolithography techniques, etching techniques and/or other semiconductor device fabrication techniques. An exemplary method for producing a passive component device (such as semiconductor device 100) will be described in detail below in relation to FIG. 4.

Referring again to FIGS. 1-2, the interdigital (or interdigitated) capacitor 104 has an approximately rectangular shape defined by a length L, width W and height H. Notably, the upper case designations L, W, H are used to define geometric dimensions of the interdigital (or interdigitated) capacitor 104. The lower case designations l, w, h are used to define geometric dimensions of sub-components (i.e., conductive plates 120a, 120b, . . . , 120n, 121a, 121b, 121n) of the interdigital (or interdigitated) capacitor 104.

As shown in FIG. 1, the length L is measured along the horizontal Y axis from a point of a side surface 134 of the capacitor 104 to a point of an opposing side surface (not shown in FIGS. 1-2) of the capacitor 104. The width W is measured along the horizontal X axis from a point on a side surface 132 of the capacitor 104 to a point on an opposing side surface (not shown in FIGS. 1-2) of the capacitor 104. The height H is measured along the vertical Z axis from a point on the bottom surface (not shown in FIGS. 1-2) of the capacitor 104 to a point on a top surface 130 of the capacitor 104. The top surface 130 of the capacitor 104 is opposed from the bottom surface (not shown in FIGS. 1-2) of the capacitor 104. The bottom surface (not shown in FIGS. 1-2) of the capacitor 104 is adjacent to the top surface 118 of the semiconducting substrate 102.

The interdigital (or interdigitated) structure of the capacitor 104 is formed by patterned conductive and dielectric materials 108, 110 disposed on or formed on the semiconducting substrate 102. In some embodiments of the present invention, one or more additional substrate layers 130 can be provided between the capacitor 104 and the semiconducting substrate 102. The substrate layers 130 can include, but are not limited to, a layer of silicon dioxide ("oxide").

As shown in FIGS. 1-2, the conductive material 108 substantially surrounds the dielectric material 110. The conductive material 108 can include, but is not limited to, gold, nickel, aluminium, copper, chromium, titanium, tungsten, platinum and silver. The dielectric material 110 can include, but is not limited to, silicon material and polymer materials. According to embodiments of the present invention, the dielectric material 110 has a relatively high permittivity e (e.g., greater than 100 farads per meter).

The conductive material 108 is patterned such that the capacitor 104 comprises two (2) opposing comb structures 124, 126 rigidly attached to an underlying layer (e.g., substrate layer 102 or 130). Comb structure 124 comprises interconnection element 204 and a plurality of conductive plates 120a, 120b, 120c, ..., 120n disposed or formed on the semiconducting substrate 102. Comb structure 126 comprises interconnection element 206 and a plurality of conductive plates 121a, 121b, 121c, ..., 121n disposed or formed on the semiconducting substrate 102. More particularly, each comb structures 124, 126 comprises a conductive interconnection element 204, 206 with at least one conductive plate extending perpendicular thereto. Each interconnection element 204, 206 has a respective conductive lead 106, 202 extending therefrom.

Each of the conductive plates 120a, 120b, 120c, ..., 120n, 121a, 121b, 121c, ..., 121n has an approximately rectangular shape defined by a length l, width w (not shown in FIGS. 1-2) and height h. The length l is measured along the horizontal Y axis. The width w is measured along the horizontal X axis. The height h is measured along the vertical Z axis. Each conductive plate 120a, 120b, 120c, ..., 120n, 121a, 121b, 121c, ..., 121n has a height-to-width (h/w) ratio that is greater than or equal to one (1), i.e., the height h is greater than or equal to the width w of the plate.

According to embodiments of the present invention, the conductive plates 120a, 120b, 120c, ..., 120n, 121a, 121b, 121c, ..., 121n have the same rectangular shape, length l, width w (not shown in FIGS. 1-2) and height h. Still, the present invention is not limited in this regard. For example, in other embodiments of the present invention, the conductive plates can have different lengths l, widths w (not shown in FIGS. 1-2) and height h.

The conductive plates 120a, 120b, 120c, ..., 120n, 121a, 121b, 121c, ..., 121n are arranged approximately perpendicular to the semiconducting substrate 102. Consequently, each of the conductive plates extends transverse to a surface 118 of the semiconducting substrate 102. The conductive plates 120a, ..., 120n are "interdigitated" with the conductive plates 121a, ..., 121n such that each conductive plate is substantially parallel to and substantially horizontally aligned with at least one adjacent conductive plate.

As shown in FIGS. 1-2, adjacent conductive plates are spaced apart from each other by a certain distance D via the dielectric material 110. According to embodiments of the present invention, the width w of the conductive plates is greater than their separation distance D. Still, embodiments of the present invention are not limited in this regard. The dimensions of the conductive plates can be selected in accordance with any particular application.

The dielectric material 110 is disposed within the spaces separating the conductive plates 120a, ..., 120n from conductive plates 121a, ..., 121n. Stated differently, the dielectric material 110 extends along a meandering or serpentine path defined by the interdigital spaces separating the interdigitated conductive plates 120a, ..., 120n and 121a, ..., 121n. Consequently, the dielectric material 110 electrically isolates respective conducive plates from their adjacent conductive plates. For example, conductive plate 120b is electrically isolated from conductive plates 121a, 121b via portions 122b, 122c of the dielectric material 110. Similarly, conductive plate 120b is electrically isolated from conductive plates 121a, 121b via portions 122b, 122c of the dielectric material 110.

The interdigitated conductive plates make up a series of parallel conductive plates, with each adjacent pair of conductive plates (and respective interposed dielectric portions 122a, 122b, 122c, ..., 122n) acting as a capacitor. For example, capacitors are formed by conductive plates 120a and 121a and conductive plates 121a and 120b. The capacitance of each adjacent pair of conductive plates is given by mathematic equation (1) provided above.

A single capacitor 104 is formed by interconnecting the conductive plates 120a, ..., 120n to form a first terminal 210, and interconnecting conductive plates 121a, ..., 121n to form a second terminal 212. These interconnections are facilitated by the interconnection elements 204, 206. Because a plurality of conductive plates 120a, ..., 120n and 121a, ..., 121n are utilized (instead of the conventional two plates), the interdigital (or interdigitated) capacitor 104 has a capacitance C that is substantially larger than the capacitance of a conventional two (2) plate capacitors having the same area.

Figure 3:
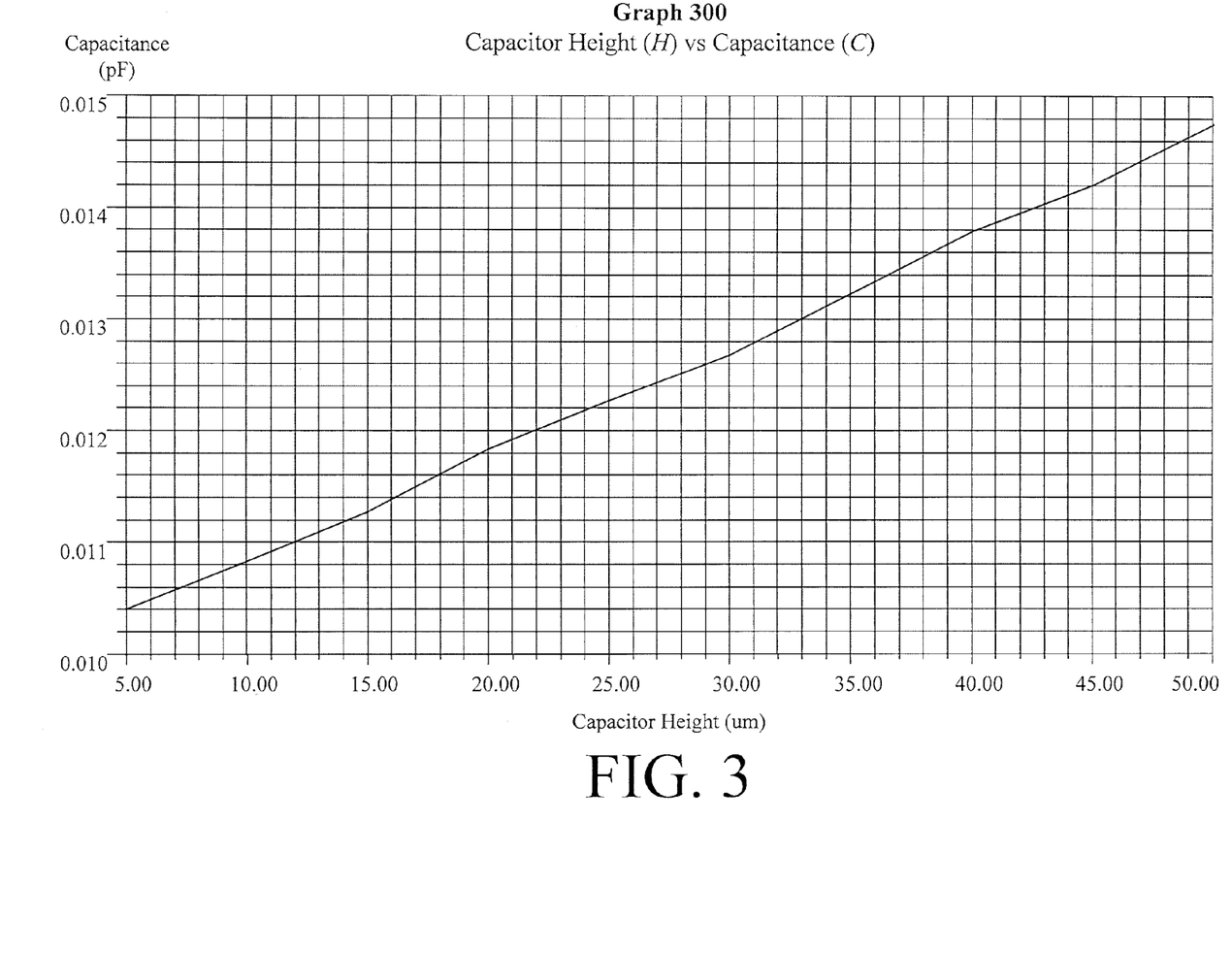
FIG. 3 is a simulation graph plotting height H versus capacitance C of a capacitor that is useful for understanding the present invention.

Referring now to FIG. 3, there is provided a simulation graph 300 plotting capacitor height H versus capacitance C of an interdigital (or interdigitated) capacitor similar to that described above in relation to FIGS. 1-2. As evident from the graph 300, the capacitance C of the interdigital (or interdigitated) capacitor increases as its height H increases. Similarly, the capacitance C of the interdigital (or interdigitated) capacitor decreases as its height H decreases. Embodiments of the present invention are not limited in this regard. For example, the conductive plates can have any shape and size selected in accordance with a particular application.

It should be noted that various embodiments of the present invention can provide capacitors with higher voltage ratings than those currently available for conventional capacitors having the same capacitance. This increased voltage rating feature of the present invention can be provided simply by rounding the corners 250, 252 of the conductive plates 120a, ..., 120n and 121a, ..., 121n, and rounding the corners 260, 262 of the dialectic material 110. The rounded corners can be formed by a corner radius at each corner. The greater the corner radius, the greater will be the degree of rounding at each corner.

Figure 4:
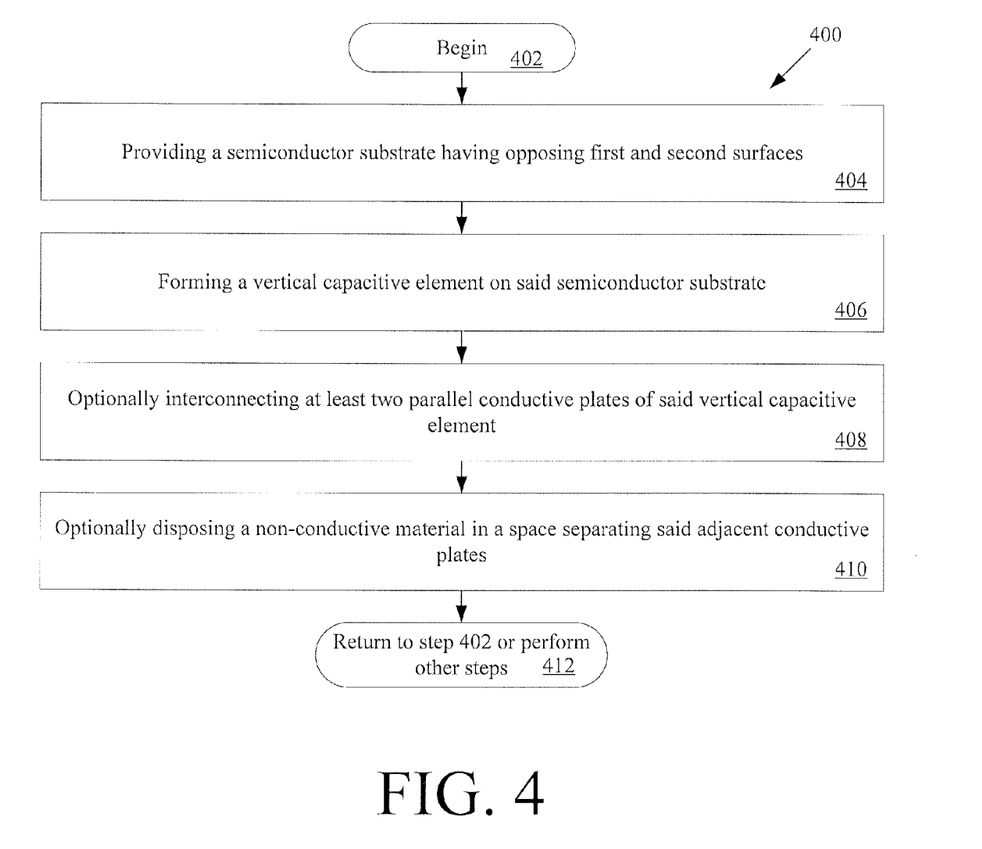
FIG. 4 is a flow diagram of an exemplary method for fabricating a semiconductor device such as that shown in FIGS. 1-2 that is useful for understanding the present invention.

Referring now to FIG. 4, there is provided a flow diagram of an exemplary method 400 for fabricating a passive element device such as that shown in FIGS. 1-2 that is useful for understanding the present invention. As shown in FIG. 4, the method 400 begins with step 402 and continues with step 404. In step 404, a semiconducting substrate is provided. The semiconducting substrate has opposing first and second sides.

The semiconducting substrate can include, but is not limited to, silicon. Next, step 406 is performed where a vertical capacitive element is formed on the semiconducting substrate. The vertical capacitive element can be formed using a deposition technique, a photolithography technique, an etching technique and/or other semiconductor device fabrication technique.

In some scenarios, two or more parallel conductive plates are formed on the semiconducting substrate using one or more of the above-listed semiconductor device fabrication techniques. Each conducive plate is formed so as to extend transverse to the first surface of the semiconducting substrate. Each conductive plate is also formed to have a height-to-width (h/w) ratio greater than or equal to one. Adjacent conductive plates are formed on the substrate so as to be spaced a distance D from each other. Also, the adjacent conductive plates are formed so as to be laterally spaced apart across the surface of the semiconductor substrate.

In other certain scenarios, two or more of the conductive plates are interconnected so as to form one or more interconnected comb structures. In these scenarios, the comb structures can be formed at the same time via deposition and/or etching.

After the vertical capacitive element is formed on the semiconducting substrate, an optional step 410 can be performed. In optional step 410, a non-conductive material is disposed in a space separating the adjacent conductive plates. Notably, step 410 would not need to be performed if the non-conductive material is selected to be air. Thereafter, step 412 is performed where the method 400 returns to step 402 or other steps are performed.

Notably, the vertical capacitive element of the present invention can be fabricates using method 400. However, the present invention is not limited in this regard. For example, the vertical capacitive element can also be fabricated using methods similar to or different from method 400. For example, the non-conductive material can be formed on the semiconducting substrate prior to the formation of the parallel conductive plates.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, the various embodiments of the invention are not limited with regard to any particular type of semiconducting substrate or conductive materials described herein. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A semiconductor device comprising:
    a substrate having a first surface and an opposing second surface;
    a vertical capacitive element disposed on said first surface of said substrate, said vertical capacitive element comprising a plurality of parallel conductive plates each attached to said first surface of said substrate and fixed in position with respect to each other, said parallel conductive plates extending transverse to said first surface of said substrate and having a height-to-width (h/w) ratio greater than or equal to one, adjacent conductive plates of said plurality of conductive plates being spaced a distance D from each other;
    an interconnection element interconnecting at least two of said plurality of parallel conductive plates;
    wherein said plurality of parallel conductive plates comprise interdigitated fingers of first and second comb structures which transversely project from said first surface.

2. The semiconductor device according to claim 1, wherein said semiconductor device is an integrated circuit semiconductor device.

3. The semiconductor device according to claim 1, wherein said substrate is a semiconducting substrate.

4. The semiconductor device according to claim 1, further comprising a ground plane disposed on said second surface of said substrate.

5. The semiconductor device according to claim 1, wherein a height of a first one of said conductive plates is different in said transversely projecting direction as compared to a second one of said conductive plates.

6. The semiconductor device according to claim 1, wherein said interdigitated fingers comprise rounded corner portions at locations opposed to said interconnection element.

7. A semiconductor device comprising:
    a substrate having first and second opposing surfaces;
    an interdigital capacitive element disposed on said first surface of said substrate, said interdigital capacitive element comprising:
        a plurality of interdigitated conductive plates attached to said first surface of said substrate and fixed in position with respect to each other, said interdigitated conductive plates each extending transverse to said first surface of said substrate, and having a height-to-width (h/w) ratio greater than or equal to one; and at least one interconnection element interconnecting at least two of said plurality of interdigitated conductive plates;

wherein said plurality of interdigitated conductive plates are arranged in parallel to form first and second comb structures which transversely project from said first surface, and wherein said interdigitated fingers comprise rounded corner portions at locations opposed to said interconnection element.

8. The semiconductor device according to claim 7, wherein said semiconductor device is an integrated circuit semiconductor device.

9. The semiconductor device according to claim 7, wherein said substrate is a semiconducting substrate.

10. The semiconductor device according to claim 7, wherein said interdigital capacitive element is a Micro-Electro-Mechanical Systems capacitor.

11. A method for fabricating a semiconductor device, said method comprising:

providing a semiconducting substrate having opposing first and second surfaces;

forming a vertical capacitive element on said semiconducting substrate, said vertical capacitive element comprising a plurality of parallel conductive plates attached to said first surface of said substrate and fixed in position with respect to each other, said parallel conductive plates each extending transverse to said first surface of said substrate and having a height-to-width (h/w) ratio greater than or equal to one, adjacent conductive plates of said plurality of conductive plates being spaced a distance D from each other forming an interconnection element interconnecting at least two of said plurality of parallel conductive plates;

wherein said plurality of parallel conductive plates form interdigitated fingers of first and second comb structures which transversely project from said first surface, and wherein a height of a first one of said conductive plates is different in said transversely projecting direction as compared to a second one of said conductive plates.

* * * * *